United States Patent
Kim et al.

(10) Patent No.: US 9,165,674 B1
(45) Date of Patent: Oct. 20, 2015

(54) SEMICONDUCTOR DEVICES AND SEMICONDUCTOR SYSTEMS

(71) Applicant: SK hynix Inc., Icheon-si Gyeonggi-do (KR)

(72) Inventors: Yeon Uk Kim, Icheon-si (KR); Jeong Tae Hwang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/527,438

(22) Filed: Oct. 29, 2014

(30) Foreign Application Priority Data

Aug. 6, 2014 (KR) .................. 10-2014-0101319

(51) Int. Cl.
  *G11C 17/16* (2006.01)
  *G11C 17/18* (2006.01)
  *G11C 5/14* (2006.01)

(52) U.S. Cl.
  CPC ............... *G11C 17/18* (2013.01); *G11C 5/148* (2013.01); *G11C 17/16* (2013.01)

(58) Field of Classification Search
  CPC .............................. G11C 17/16; G11C 5/148
  USPC .................................................... 365/96, 226
  See application file for complete search history.

(56) References Cited

U.S. PATENT DOCUMENTS

| | | | |
|---|---|---|---|
| 2005/0088874 A1* | 4/2005 | Hamada et al. | 365/154 |
| 2009/0097330 A1* | 4/2009 | Yoko | 365/189.05 |
| 2009/0310266 A1 | 12/2009 | Etherton et al. | |
| 2012/0120733 A1* | 5/2012 | Son et al. | 365/189.02 |
| 2012/0256662 A1* | 10/2012 | Cho | 327/142 |
| 2013/0286759 A1* | 10/2013 | Park et al. | 365/201 |
| 2014/0085999 A1* | 3/2014 | Kang | 365/222 |
| 2014/0241085 A1* | 8/2014 | Ryu et al. | 365/200 |

FOREIGN PATENT DOCUMENTS

KR  1020140029952 A  3/2014

* cited by examiner

*Primary Examiner* — Hoai V Ho
*Assistant Examiner* — Jay Radke
(74) *Attorney, Agent, or Firm* — William Park & Associates Ltd.

(57) ABSTRACT

Semiconductor devices are provided. The semiconductor device may include a control signal generator and a fuse array portion. The control signal generator may generate a power control signal, disable the power control signal to a ground voltage signal level during a power-up period, and enable the power control signal to a power supply voltage signal level from a moment that the power-up period terminates until a moment that a mode register set operation terminates. The fuse array portion may execute a boot-up operation while the power control signal is enabled. The fuse array portion may generate fuse data according to an electrical open/short state of a fuse. The fuse may be selected by a level combination of address signals during the boot-up operation.

20 Claims, 6 Drawing Sheets

SEMICONDUCTOR DEVICES AND SEMICONDUCTOR SYSTEMS

CROSS-REFERENCE TO RELATED APPLICATION

The present application claims priority under 35 U.S.C. 119(a) to Korean Application No. 10-2014-0101319, filed on Aug. 6, 2014, in the Korean Intellectual Property Office, which is incorporated herein by reference in its entirety as set forth in full.

BACKGROUND

1. Technical Field

Embodiments of the present disclosure generally relate to semiconductor devices and semiconductor systems.

2. Related Art

Semiconductor devices may be designed to include fuses that store information necessary for various internal control operations. For example, repair information on abnormal memory cells is one example of stored information. General fuses can be programmed at a wafer level. This is possible because the logic level of each piece of data is determined according to an electrical open/short state pertaining to a fuse. However, once the semiconductor devices are encapsulated to form semiconductor packages, it may be impossible to program the general fuses in the semiconductor packages. To solve the aforementioned disadvantage E-fuses may be used. Each of the e-fuses may be realized using a transistor. For example, a MOS transistor may be used as the transistor. In such a case, data may be stored in the e-fuse by changing an electrical resistance value between the gate terminal and the source/drain terminal of the MOS transistor. The MOS transistor being used as the e-fuse. That is, the e-fuse may be electrically open or short according to a resistance value between the gate terminal and the source/drain terminal of the MOS transistor employed as the e-fuse.

In order to correctly recognize the data stored in the e-fuses, a size of the transistors employed as the e-fuses has to be increased. Additionally, amplifiers have to be used without increasing the size of the transistors employed as the e-fuses. However, in any case, there may be limitations in increasing the integration density of the semiconductor devices including the e-fuses.

Recently, e-fuse arrays have been proposed to solve the limitations of the integration density and to store the information necessary for various internal control operations. Accordingly, the integration density of the semiconductor devices may be improved.

SUMMARY

According to an embodiment, a semiconductor device may include a control signal generator and a fuse array portion. The control signal generator may generate a power control signal, disable the power control signal to a ground voltage signal level during a power-up period, and enable the power control signal to a power supply voltage signal level from a point of time that the power-up period terminates until a point of time that a mode register set operation terminates. The fuse array portion may execute a boot-up operation while the power control signal is enabled. The fuse array portion may generate fuse data according to an electrical open/short state of a fuse. The fuse may be selected by a level combination of address signals during the boot-up operation.

According to an embodiment, a semiconductor device may include an operation control signal generator, a power control signal generator, and a fuse array portion. The operation control signal generator may generate an operation control signal, disable the operation control signal to a ground voltage signal level during a power-up period, enable the operation control signal in response to a power-up signal, and disable the operation control signal in response to a mode register set signal. The power control signal generator may generate a power control signal, disable the power control signal to a ground voltage signal level during the power-up period, enable the power control signal in response to a pulse signal, and disable the power control signal in response to the operation control signal. The fuse array portion may execute a boot-up operation while the power control signal is enabled. The fuse array portion may generate fuse data according to an electrical open/short state of a fuse. The fuse may be selected by a level combination of address signals during the boot-up operation.

According to an embodiment, a semiconductor system may include a control unit and a cell array portion. The control unit may generate a power control signal, disable the power control signal to a ground voltage signal level during a power-up period and enable the power control signal to a power supply voltage signal level from a point of time that the power-up period terminates until a point of time that a mode register set operation terminates. The cell array portion may execute a write operation or a read operation while the power control signal is enabled. The cell array portion may store data in a memory cell selected by a level combination of address signals during the write operation or may output data stored in a memory cell selected by a level combination of the address signals during the read operation.

DETAILED DESCRIPTION OF THE EMBODIMENTS

Embodiments of the present disclosure will be described hereinafter with reference to the accompanying drawings. However, the embodiments described herein are for illustrative purposes only and are not intended to limit the scope of the present disclosure.

Figure 1:
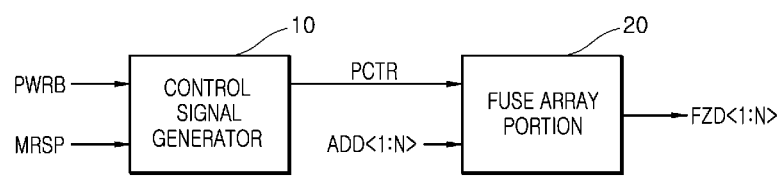
FIG. 1 is a block diagram illustrating a representation of a semiconductor device according to an embodiment.

Referring to FIG. 1, a semiconductor device according to an embodiment may include a control signal generator 10 and a fuse array portion 20.

The control signal generator 10 may receive a power-up signal PWRB and a mode register set signal MRSP to generate a power control signal PCTR. The power control signal PCTR may be disabled to have a ground voltage signal VSS level during a power-up period. The power control signal PCTR may be enabled to have a power supply voltage single VDD level from a point of time when the power-up period terminates until a point of time when a mode register set mode terminates. The power-up signal PWRB may have a level of a power supply voltage signal VDD during the power-up period that the power supply voltage signal VDD increases from a ground voltage signal VSS level to a target voltage level. A level of the power-up signal PWRB may be changed if the power supply voltage signal VDD reaches the target voltage level. The mode register set signal MRSP may be enabled after a predetermined period from a point of time that the power-up period terminates. The power control signal PCTR may be enabled to generate a plurality of internal voltages. The internal voltages may be used in the fuse array portion 20 during a boot-up operation.

The fuse array portion 20 may execute the boot-up operation while the power control signal PCTR is enabled and may generate fuse data FZD<1:N> in response to an electrical open/short state of a fuse. The fuse may be selected by a level combination of address signals ADD<1: N>. The boot-up operation may be an operation that outputs the fuse data FZD<1:N>. The fuse data FZD<1:N> may be programmed according to electrical open/short states of fuses in the fuse array portion 20 to include information for controlling internal operations of the semiconductor device.

Figure 2:
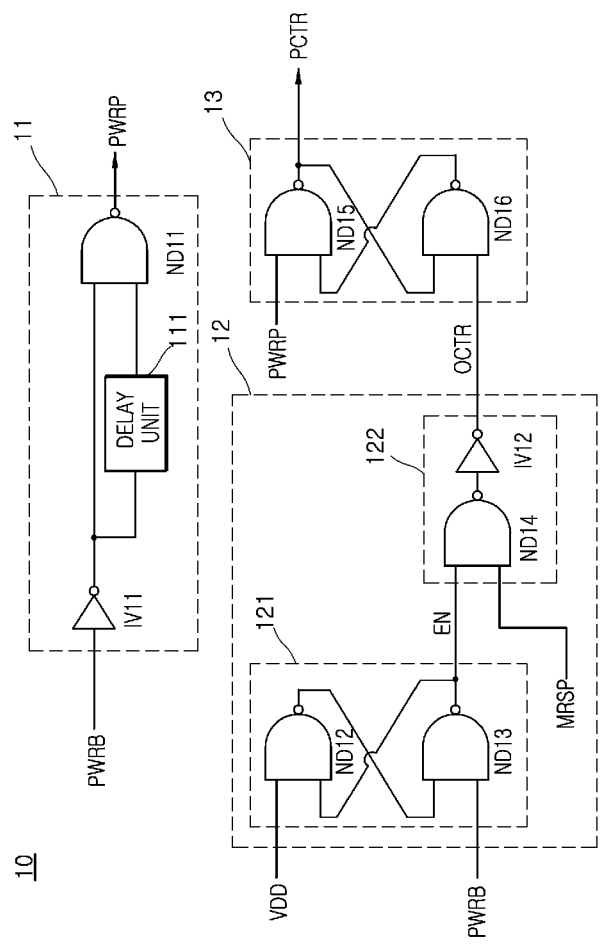
FIG. 2 is a logic circuit diagram illustrating a representation of a control signal generator included in the semiconductor device of FIG. 1.

Referring to FIG. 2, the control signal generator 10 may include a pulse signal generator 11, an operation control signal generator 12 and a power control signal generator 13.

The pulse signal generator 11 may include an inverter IV11. The inverter IV11 may inversely buffer the power-up signal PWRB. A delay unit 111 may inversely retard an output signal of the inverter IV11. A NAND gate ND11 may execute a NAND operation on the output signal of the inverter IV11 and an output signal of the delay unit 111 to generate a pulse signal PWRP. That is, the pulse signal generator 11 may generate the pulse signal PWRP including a pulse having a pulse width that corresponds to a delay time of the delay unit 111 from a point of time that the power-up signal PWRB is enabled.

The operation control signal generator 12 may include a latch unit 121 and a logic unit 122.

The latch unit 121 may include a NAND gate ND12. The NAND gate may execute a NAND operation of the power supply voltage signal VDD and an enablement signal EN. A NAND gate ND13 may execute a NAND operation on the power-up signal PWRB and on an output signal of the NAND gate ND12 to generate the enablement signal EN. That is, the latch unit 121 may receive the power-up signal PWRB to generate the enablement signal EN that has a ground voltage signal VSS level during the power-up period and has a power supply voltage signal VDD level after the power-up period. The latch unit 121 may be realized using a latch circuit comprised of the general NAND gates ND12 and ND13.

The logic unit 122 may include a NAND gate ND14. The NAND gate ND14 may execute a NAND operation on the enablement signal EN and the mode register set signal MRSP. The logic unit 122 may also include an inverter IV12. The inverter IV12 may inversely buffer an output signal of the NAND gate ND14 to generate an operation control signal OCTR. That is, the logic unit 122 may generate the operation control signal OCTR which is enabled to have a power supply voltage signal VDD level if both the enablement signal EN and the mode register set signal MRSP have a power supply voltage signal VDD level. In some embodiments, the mode register set signal MRSP may be set to be enabled at a point of time that a mode register set operation for storing information controlling internal operations of the semiconductor device in a mode register set (MRS) terminates after the power-up period.

As a result, the operation control signal generator 12 may generate the operation control signal OCTR. The operation control signal OCTR may be disabled to have a ground voltage signal VSS level during the power-up period and may be enabled to have a power supply voltage signal VDD level from a point of time that the power-up period terminates until a point of time that the mode register set operation terminates.

The power control signal generator 13 may include a NAND gate ND15. The NAND gate ND15 may execute a NAND operation of the pulse signal PWRP and an output signal of a NAND gate ND16 to generate the power control signal PCTR. The power control signal generator 13 may include the NAND gate ND16. The NAND gate ND16 may execute a NAND operation on the operation control signal OCTR and the power control signal PCTR. The power control signal generator 13 may be realized using a latch circuit comprised of the general NAND gates ND15 and ND16.

As a result, the power control signal generator 13 may generate the power control signal PCTR. The power control signal PCTR may be enabled to have a power supply voltage signal VDD level if a pulse of the pulse signal PWRP is inputted thereto and may be disabled to have a ground voltage signal VSS level if the operation control signal OCTR is disabled.

Figure 3:
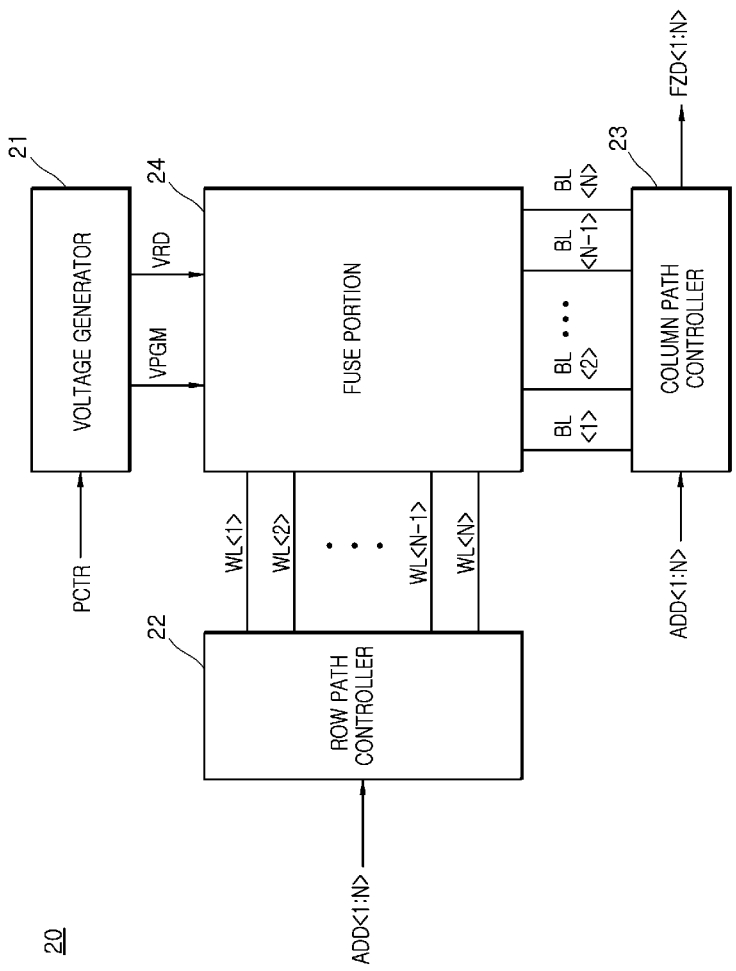
FIG. 3 is a block diagram illustrating a representation of a fuse array portion included in the semiconductor device of FIG. 1.

Referring to FIG. 3, the fuse array portion 20 may include a voltage generator 21, a row path controller 22, a column path controller 23 and a fuse portion 24.

The voltage generator 21 may generate a first internal voltage signal VPGM for cutting fuses and a second internal voltage signal VRD for outputting the fuse data FZD<1:N> while the power control signal PCTR is enabled. Although FIG. 3 illustrates an example in which the voltage generator 21 generates the first and second internal voltage signals VPGM and VRD, the example is not limited thereto. For example, in some embodiments, the voltage generator 21 may be configured to generate three or more internal voltage signals.

The row path controller 22 may select one of a plurality of word lines WL<1:N> according to a level combination of the address signals ADD<1:N>.

The column path controller 23 may select one of a plurality of bit lines BL<1:N> according to a level combination of the address signals ADD<1:N>. In addition, the column path controller 23 may sense and amplify data on the selected bit line of the bit lines BL<1:N> to generate one of the fuse data FZD<1:N>.

The fuse portion 24 may include a plurality of fuses (not shown) which are connected to the plurality word lines WL<1:N> and the plurality of bit lines BL<1:N>. Each of the fuses may be realized using, for example, an e-fuse.

As a result, while the power control signal PCTR is enabled, the fuse array portion 20 may execute the boot-up operation to generate the fuse data FZD<1:N> according to electrical open/short states of the fuses selected by a level combination of the address signal ADD<1:N>.

Figure 4:
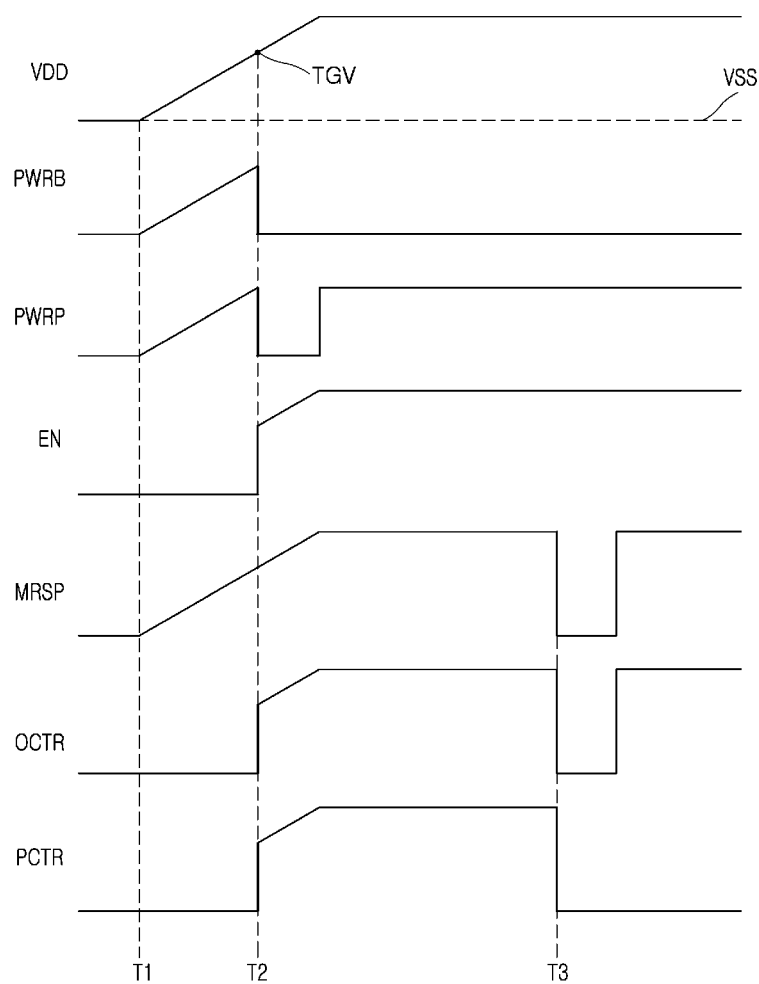
FIG. 4 is a timing diagram illustrating a representation of an operation of a semiconductor device according to an embodiment.

An operation of the semiconductor devices having the aforementioned configurations will be described hereinafter with reference to FIG. 4 in conjunction with an example in which the semiconductor device operates during the power-up period and executes the boot-up operation from a point of time that the power-up period terminates until a point of time that the mode register set operation terminates.

First, in the power-up period from a point of time "T1" to a point of time "T2", a level of the power supply voltage signal VDD may increase from a ground voltage VSS level. In such cases, a level of the power-up signal PWRB may also increase to have the same level or substantially the same level as the power supply voltage signal VDD. In addition, a level of the mode register set signal MRSP may also increase to have the same level or substantially the same level as the power supply voltage signal VDD.

The pulse signal generator 11 may receive the power-up signal PWRB to generate the pulse signal PWRP. The level of the pulse signal PWRP may increase along with a level of the power supply voltage signal VDD.

More specifically, in the power-up period, internal transistors of the inverter IV11 included in the pulse signal generator 11 may generate an output signal having a ground voltage signal VSS level because a level of the power-up signal PWRB increases. In addition, in the power-up period, internal transistors of the NAND gate ND11 included in the pulse signal generator 11 may generate the pulse signal PWRP having a power supply voltage signal VDD level because an output signal of the inverter IV11 has a ground voltage signal VSS level.

The latch unit 121 of the operation control signal generator 12 may generate the enablement signal EN having a ground voltage signal VSS level because a level of the power-up signal PWRB increases along with a level of the power supply voltage signal VDD.

More specifically, internal transistors of the NAND gate ND12 included in the latch unit 121 may generate an output signal having a power supply voltage signal VDD level because a level of the power supply voltage signal VDD increases. In addition, internal transistors of the NAND gate ND13 included in the latch unit 121 may generate the enablement signal EN having a ground voltage signal VSS level because both a level of the power-up signal PWRB and a level of the output signal of the NAND gate ND12 increase.

The logic unit 122 of the operation control signal generator 12 may generate the operation control signal OCTR. The control signal OCTR may be disabled to have a ground voltage signal VSS level because the enablement signal EN has a ground voltage signal VSS level and the mode register set signal MRSP has a level lower than a target voltage TGV level. The target voltage TGV level may be set to be equal to or higher than a level at which the semiconductor device can normally operates.

More specifically, internal transistors of the NAND gate ND14 included in the logic unit 122 may generate an output signal having power supply voltage signal VDD level because the enablement signal EN has a ground voltage signal VSS level. In addition, internal transistors of the inverter IV12 included in the logic unit 122 may generate the operation control signal OCTR having a ground voltage signal VSS level because an output signal of the NAND gate ND14 has a power supply voltage signal VDD level.

The power control signal generator 13 may generate the power control signal PCTR. The power control signal PCTR may be disabled to have a ground voltage signal VSS level because the pulse signal PWRP has a level lower than the target voltage TGV level and the operation control signal OCTR has a ground voltage signal VSS level.

More specifically, internal transistors of the NAND gate ND16 included in the power control signal generator 13 may generate an output signal having a power supply voltage signal VDD level because the operation control signal OCTR has a ground voltage signal VSS level. In addition, internal transistors of the NAND gate ND15 included in the power control signal generator 13 may generate the power control signal PCTR having a ground voltage signal VSS level because both the pulse signal PWRP and an output signal of the NAND gate ND16 have a power supply voltage signal VDD level.

The fuse array portion 20 does not execute the boot-up operation in response to the power control signal PCTR which is disabled to have a ground voltage signal VSS level.

Next, if a level of the power supply voltage signal VDD reaches the target voltage TGV level at the point of time "T2", a level of the power-up signal PWRB may be changed into a ground voltage signal VSS level. In contrast, a level of the mode register set signal MRSP may continuously increase along a level of the power supply voltage signal VDD.

The pulse signal generator 11 may receive the power-up signal PWRB having a ground voltage signal VSS level to generate the pulse signal PWRP including a pulse having a ground voltage signal VSS level.

The latch unit 121 of the operation control signal generator 12 may generate the enablement signal EN having a power supply voltage signal VDD level because the power-up signal PWRB has a ground voltage signal VSS level. The logic unit 122 of the operation control signal generator 12 may receive the enablement signal EN and the mode register set signal MRSP having power supply voltage signal VDD levels to generate the operation control signal OCTR which is enabled to have a power supply voltage signal VDD level.

The power control signal generator 13 may generate the power control signal PCTR. The power control signal may be enabled to have a power supply voltage signal VDD level because the pulse signal PWRP has a ground voltage signal VSS level and the operation control signal OCTR has a power supply voltage signal VDD level.

The voltage generator 21 of the fuse array portion 20 may generate the first internal voltage signal VPGM and the second internal voltage signal VRD in response to the power control signal PCTR which is enabled to have a power supply voltage signal VDD level. The row path controller 22 may select one of the plurality of word lines WL<1:N> according to a level combination of the address signals ADD<1:N>. The column path controller 23 may select one of the plurality of bit lines BL<1:N> according to a level combination of the address signals ADD<1:N>. In addition, the column path controller 23 may sense and amplify data on the selected bit line of the bit lines BL<1:N> to generate one of the fuse data FZD<1:N>. That is, the fuse portion 24 may execute the boot-up operation in response to the power control signal PCTR which is enabled to have a power supply voltage signal VDD level and may generate the fuse data FZD<1:N> according to electrical open/short states of the fuses which are selected by level combinations of the address signal ADD<1:N>.

Next, if the mode register set operation terminates at a point of time "T3", the mode register set signal MRSP may be enabled to have a ground voltage signal VSS level.

The pulse signal generator 11 may receive the power-up signal PWRB having a ground voltage signal VSS level to generate the pulse signal PWRP having a power supply voltage signal VDD level.

The latch unit 121 of the operation control signal generator 12 may generate the enablement signal EN having a power supply voltage signal VDD level because the power-up signal PWRB has a ground voltage signal VSS level. The logic unit 122 of the operation control signal generator 12 may receive the enablement signal EN having a power supply voltage signal VDD level and the mode register set signal MRSP having a ground voltage signal VSS level to generate the operation control signal OCTR which is disabled to have a ground voltage signal VSS level.

The power control signal generator 13 may generate the power control signal PCTR. The power control signal PCTR may be disabled to have a ground voltage signal VSS level because the pulse signal PWRP has a power supply voltage signal VDD level and the operation control signal OCTR has a ground voltage signal VSS level.

The fuse array portion 20 does not execute the boot-up operation in response to the power control signal PCTR which is disabled to have a ground voltage signal VSS level.

The semiconductor device having the aforementioned configuration may execute a stable boot-up operation by generating the power control signal PCTR for creating a plurality of internal voltage signals, which are used in the fuse array portion 20, only during the boot-up operation.

Figure 5:
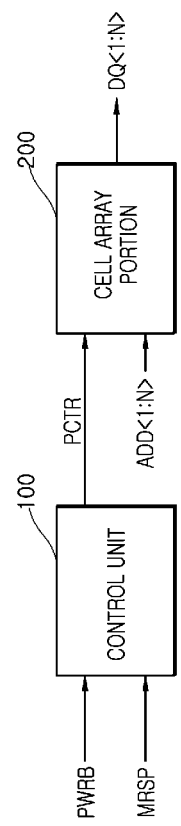
FIG. 5 is a block diagram illustrating a representation of a semiconductor system according to an embodiment.

FIG. 5 is a block diagram illustrating a representation of a semiconductor system according to an embodiment.

Referring to FIG. 5, the semiconductor system according to an embodiment may include a control unit 100 and a cell array portion 200.

The control unit 100 may receive a power-up signal PWRB and a mode register set signal MRSP to generate a power control signal PCTR. The power control signal PCTR may be disabled to have a ground voltage signal VSS level during a power-up period and may be enabled to have a power supply voltage single VDD level from a point of time that the power-up period terminates until a point of time that a mode register set mode terminates. The power-up signal PWRB may have a level of a power supply voltage signal VDD during the power-up period that the power supply voltage signal VDD increases from a ground voltage signal VSS level to a target voltage level. A level of the power-up signal PWRB may be changed if the power supply voltage signal VDD reaches the target voltage level. The mode register set signal MRSP may be enabled after a predetermined period from a point of time that the power-up period terminates. The power control signal PCTR may be enabled to generate a plurality of internal voltages. The plurality of internal voltage may be used in the cell array portion 200 during a boot-up operation. The control unit 100 may be designed to have substantially the same configuration as the control signal generator 10 illustrated in FIG. 1. Thus, a detailed description of the control unit 100 will be omitted hereinafter.

The control unit 100 may be realized using one of various circuits, for example but not limited to, a controller or a processor.

The cell array portion 200 may execute a write operation or a read operation while the power control signal PCTR is enabled. That is, at least one of a plurality of memory cells in the cell array portion 200 may be selected according to a level combination of address signals ADD<1: N> while the power control signal PCTR is enabled. Data DQ<1:N> may be stored in the selected memory cells during the write operation or data DQ<1:N> stored in the selected memory cells may be outputted during the read operation. The cell array portion 200 may have substantially the same configuration as the fuse array portion 20 illustrated in FIG. 1 except that the plurality of memory cells instead of the plurality of fuses are arrayed therein. Thus, a detailed description of the cell array portion 200 will be omitted hereinafter.

The cell array portion 200 may include the plurality of memory cells and may correspond to a memory device.

The semiconductor system having the aforementioned configuration may execute a stable write operation and a stable read operation by generating the power control signal PCTR for creating a plurality of internal voltage signals, which are used in the cell array portion 200, only during the write operation and the read operation.

Figure 6:
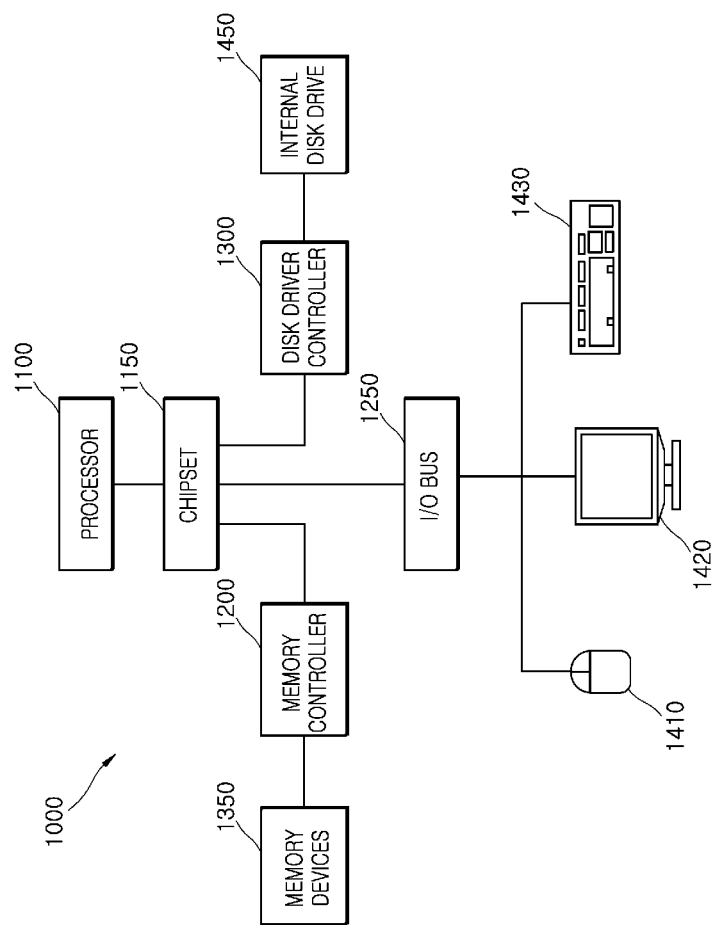
FIG. 6 illustrates a block diagram of an example of a representation of a system employing the semiconductor devices in accordance with the embodiments discussed above with relation to FIGS. 1-5.

The semiconductor devices and semiconductor systems discussed above (see FIGS. 1-5) are particular useful in the design of memory devices, processors, and computer systems. For example, referring to FIG. 6, a block diagram of a system employing the semiconductor devices in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device and/or semiconductor system as discussed above with reference to FIGS. 1-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or semiconductor system as discussed above with relation to FIGS. 1-5, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data. Also, the memory devices 1350 may include a plurality of fuses arrayed therein.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the semiconductor devices and/or semiconductor systems as discussed above with relation to FIGS. 1-5. In alternate embodiments, such as cellular phones or digital cameras, the components may differ from the embodiments illustrated in FIG. 6.

What is claimed is:

1. A semiconductor device comprising:
   a control signal generator suitable for generating a power control signal, disabling the power control signal to have a ground voltage signal level during a power-up period, and enabling the power control signal to a power supply voltage signal level from a point of time that the power-up period terminates until a point of time that a mode register set operation terminates; and
   a fuse array portion suitable for executing a boot-up operation while the power control signal is enabled,
   wherein the fuse array portion generates fuse data according to an electrical open/short state of a fuse, and
   wherein the fuse is selected by a level combination of address signals during the boot-up operation.

2. The semiconductor device of claim 1, wherein the power-up period is a time period when the power supply voltage signal increases from a ground voltage signal level to a target voltage level.

3. The semiconductor device of claim 1, wherein the power control signal is enabled to generate a plurality of internal voltage signals used in the fuse array portion during the boot-up operation.

4. The semiconductor device of claim 3, wherein the plurality of internal voltage signals include a first internal voltage signal for cutting fuses in the fuse array portion during the boot-up operation and a second internal voltage signal for outputting the fuse data generated according to electrical open/short states of the fuses in the fuse array portion during the boot-up operation.

5. The semiconductor device of claim 1, wherein the control signal generator includes:
   a pulse signal generator suitable for generating a pulse signal including a pulse created in response to a power-up signal;
   an operation control signal generator suitable for generating an operation control signal, disabling the operation control signal to a ground voltage signal level during the power-up period, and enabling the operation control signal to a power supply voltage signal level from a point of time that the power-up period terminates until a point of time that the mode register set operation terminates; and
   a power control signal generator suitable for generating the power control signal, enabling the power control signal in response to the pulse of the pulse signal, and disabling the power control signal in response to the operation control signal,
   wherein the mode register set operation is executed in response to a mode register set signal, and
   wherein the power-up signal is enabled after the power-up period.

6. The semiconductor device of claim 5, wherein the mode register set signal is enabled to a ground voltage signal level during a predetermined time from a point of time that the mode register set operation terminates.

7. The semiconductor device of claim 5, wherein the mode register set signal is enabled after a predetermined period from a point of time that the power-up period terminates.

8. The semiconductor device of claim 5, wherein the operation control signal generator includes:
   a latch unit suitable for receiving the power-up signal to generate an enablement signal having a ground voltage signal level during the power-up period and having a power supply voltage signal level after the power-up period; and
   a logic unit suitable for generating the operation control signal, enabling the operation control signal in response to the enablement signal, and disabling the operation control signal in response to the mode register set signal.

9. A semiconductor device comprising:
   an operation control signal generator suitable for generating an operation control signal, disabling the operation control signal to a ground voltage signal level during a power-up period, enabling the operation control signal in response to a power-up signal, and disabling the operation control signal in response to a mode register set signal;
   a power control signal generator suitable for generating a power control signal, disabling the power control signal to a ground voltage signal level during the power-up period, enabling the power control signal in response to a pulse signal, and disabling the power control signal in response to the operation control signal; and
   a fuse array portion suitable for executing a boot-up operation while the power control signal is enabled,
   wherein the fuse array portion generates fuse data according to an electrical open/short state of a fuse, and
   wherein the fuse is selected by a level combination of address signals during the boot-up operation.

10. The semiconductor device of claim 9, wherein the power-up period is a time period when a power supply voltage signal increases from a ground voltage signal level to a target voltage level.

11. The semiconductor device of claim 9, wherein the power control signal is enabled to generate a plurality of internal voltage signals used in the fuse array portion during the boot-up operation.

12. The semiconductor device of claim 11, wherein the plurality of internal voltage signals include a first internal voltage signal for cutting fuses in the fuse array portion during the boot-up operation and a second internal voltage signal for outputting the fuse data generated according to electrical open/short states of the fuses in the fuse array portion during the boot-up operation.

13. The semiconductor device of claim 9, wherein the mode register set signal is enabled to a ground voltage signal level during a predetermined time from a point of time that a mode register set operation terminates.

14. The semiconductor device of claim 9, wherein the mode register set signal is enabled after a predetermined period from a point of time that the power-up period terminates.

15. The semiconductor device of claim 9, further comprising a pulse signal generator suitable for generating a pulse signal including a pulse created in response to the power-up signal,
   wherein the power-up signal is enabled after the power-up period.

16. The semiconductor device of claim 9, wherein the operation control signal generator includes:
   a latch unit suitable for receiving the power-up signal to generate an enablement signal having a ground voltage signal level during the power-up period and having a power supply voltage signal level after the power-up period; and a logic unit suitable for generating the operation control signal, enabling the operation control signal in response to the enablement signal, and disabling the operation control signal in response to the mode register set signal.

17. A semiconductor system comprising:

a control unit suitable for generating a power control signal, disabling the power control signal to a ground voltage signal level during a power-up period, and enabling the power control signal to a power supply voltage signal level from a point of time that the power-up period terminates until a point of time that a mode register set operation terminates; and a cell array portion suitable for executing a write operation or a read operation while the power control signal is enabled, wherein the cell array portion stores data in a memory cell selected by a level combination of address signals during the write operation and outputs data stored in a memory cell selected by a level combination of the address signals during the read operation.

18. The semiconductor system of claim 17, wherein the power-up period is a time period when the power supply voltage signal increases from a ground voltage signal level to a target voltage level; and wherein the power control signal is enabled to generate a plurality of internal voltage signals used in the cell array portion during the write operation or the read operation.

19. The semiconductor system of claim 17, wherein the control unit includes:

a pulse signal generator suitable for generating a pulse signal including a pulse created in response to a power-up signal;

an operation control signal generator suitable for generating an operation control signal, disabling the operation control signal to a ground voltage signal level during the power-up period, and enabling the operation control signal to a power supply voltage signal level from a point of time that the power-up period terminates until a point of time that the mode register set operation terminates; and a power control signal generator suitable for generating the power control signal, enabling the power control signal in response to the pulse of the pulse signal, and disabling the power control signal in response to the operation control signal, wherein the mode register set operation is executed in response to a mode register set signal, and wherein the power-up signal is enabled after the power-up period.

20. The semiconductor system of claim 19, wherein the operation control signal generator includes:

a latch unit suitable for receiving the power-up signal to generate an enablement signal having a ground voltage signal level during the power-up period and having a power supply voltage signal level after the power-up period; and a logic unit suitable for generating the operation control signal, enabling the operation control signal in response to the enablement signal, and disabling the operation control signal in response to the mode register set signal.

* * * * *